United States Patent [19]
Lin et al.

[11] Patent Number: 5,994,219
[45] Date of Patent: Nov. 30, 1999

[54] ADD ONE PROCESS STEP TO CONTROL THE SI DISTRIBUTION OF ALSICU TO IMPROVED METAL RESIDUE PROCESS WINDOW

[75] Inventors: Hsiang-Lin Lin, Taipei; Han-Chung Chen, Hsin-Chu, both of Taiwan

[73] Assignee: Taiwan Semiconductor Manufacturing Company, Ltd., Hsin-Chu, Taiwan

[21] Appl. No.: 09/090,498

[22] Filed: Jun. 4, 1998

[51] Int. Cl.$^6$ .................................................. H01L 21/441
[52] U.S. Cl. ........................ 438/669; 438/654; 438/688
[58] Field of Search .................... 438/715, 620, 438/643, 669, 683, 688, 654

[56] References Cited

U.S. PATENT DOCUMENTS

| | | | |
|---|---|---|---|
| 4,716,050 | 12/1987 | Green et al. | 427/99 |
| 5,658,828 | 8/1997 | Lin et al. | 438/643 |
| 5,711,824 | 1/1998 | Shinohara et al. | 438/652 |
| 5,716,869 | 2/1998 | Hibino et al. | 438/688 |
| 5,750,439 | 5/1998 | Naito | 438/648 |
| 5,759,868 | 6/1998 | Ogawa et al. | 438/688 |
| 5,798,301 | 8/1998 | Lee et al. | 438/653 |
| 5,814,556 | 9/1998 | Wee et al. | 438/620 |
| 5,843,842 | 12/1998 | Lee et al. | 438/688 |

*Primary Examiner*—Olik Chaudhuri
*Assistant Examiner*—Anh Duy Mai
*Attorney, Agent, or Firm*—George O. Saile; Stephen B. Ackerman; Rosemary L. S. Pike

[57] ABSTRACT

A new method of metal deposition with reduced metal residue after metal etching by cooling the wafer before metal deposition is described. A first patterned conducting layer is provided overlying a dielectric layer on the surface of a semiconductor substrate. The wafer is cooled to a temperature of less than about 20° C. Thereafter, a metal layer is deposited overlying the first patterned conducting layer. The metal layer is etched away where it is not covered by a mask to complete formation of the metal line. Cooling of the wafer before metal deposition decreases the metal residue found after metal etching.

16 Claims, 6 Drawing Sheets

ADD ONE PROCESS STEP TO CONTROL THE SI DISTRIBUTION OF ALSICU TO IMPROVED METAL RESIDUE PROCESS WINDOW

BACKGROUND OF THE INVENTION (1) Field of the Invention

The invention relates to a method of metallization in the fabrication of integrated circuits, and more particularly, to a method of metallization in which metal residue is decreased after metal etching in the manufacture of integrated circuits.

(2) Description of the Prior Art

In the manufacture of integrated circuit devices, multiple layers of metallization are often utilized.

FIG. 1 illustrates a portion of a partially completed integrated circuit device. Semiconductor device structures such as gate electrodes, not shown, may be formed in and on a semiconductor substrate 10. An insulating layer 12 is deposited over the device structures and planarized. A first metallization is performed to form metal lines 14. An intermetal dielectric layer 16 is deposited over the metal lines and filling the gaps between the lines as is conventional in the art. A second level of metallization is now to be formed.

Typically, a first barrier layer of titanium 18 is deposited over the intermetal dielectric 16. Then the metal layer 20 is deposited over the titanium layer. This metal layer 20 is typically an aluminum alloy such as AlSiCu. A capping titanium nitride layer 22 is then formed.

The metal layers 22, 20, and 18 are then etched to leave the desired metal line 24, shown in FIG. 2. However, after etching, metal residue 28 has been found on the surface of the intermetal dielectric layer 16, as shown in FIG. 2. These metal residues may cause shorting of the device. It is possible that the metal residue may be left because of silicon precipitates 26, shown in FIG. 1. It may be that these silicon precipitates are not etched away when the metal layers are etched, but themselves act as a mask so that metal residues 28 are left. These metal residues may comprise titanium from the titanium layer 18 or they may comprise aluminum or an aluminum alloy. It has been discovered that the transfer system in the metal deposition chamber can effect residue.

U.S. Pat. No. 5,658,828 to Lin et al teaches a method of forming an aluminum contact in which a first titanium layer is deposited at 0 to 375° C., then an aluminum layer is deposited at 0 to 300° C. Without breaking vacuum, another layer of aluminum is deposited at 400 to 550° C. U.S. Pat. No. 4,716,050 to Green et al teaches a surface treatment at a temperature of less than 100° C. to produce a surface layer comprising hydroxl groups before deposition of aluminum.

SUMMARY OF THE INVENTION

A principal object of the present invention is to provide an effective and very manufacturable method of metal deposition in the fabrication of integrated circuits.

A further object of the invention is to provide a method for metal deposition which decreases the formation of metal residue after metal etching.

A still further object of the invention is to provide a method for metal deposition which decreases metal residue after metal etching by cooling the wafer before metal deposition.

In accordance with the objects of this invention a new method of metal deposition with reduced metal residue after metal etching by cooling the wafer before metal deposition is achieved. A first patterned conducting layer is provided overlying a dielectric layer on the surface of a semiconductor substrate and covered with an interlevel dielectric layer. The wafer is cooled to a temperature of less than about 20° C. Thereafter, a metal layer is deposited overlying the interlevel dielectric layer. The metal layer is etched away where it is not covered by a mask to complete formation of the metal line. Cooling of the wafer before metal deposition decreases the metal residue found after metal etching.

BRIEF DESCRIPTION OF THE DRAWINGS

In the accompanying drawings forming a material part of this description, there is shown.

DESCRIPTION OF THE PREFERRED EMBODIMENTS

Figure 1:
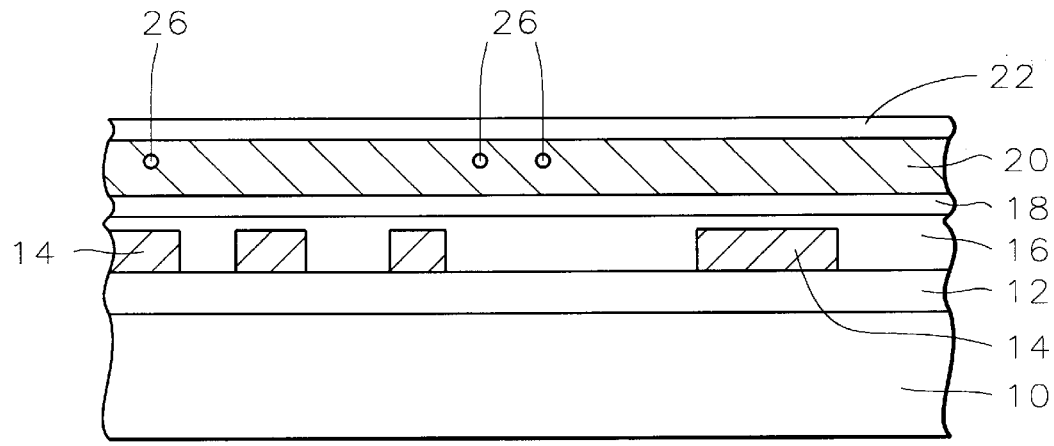
FIGS. 1 and 2 schematically illustrate in cross-sectional representation the metal residue problem of the prior art.
Figure 2:
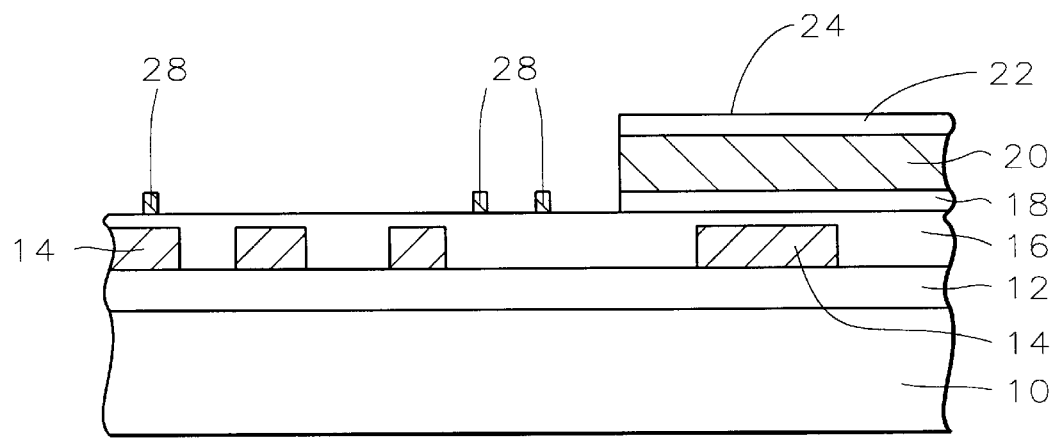
Figure 3:
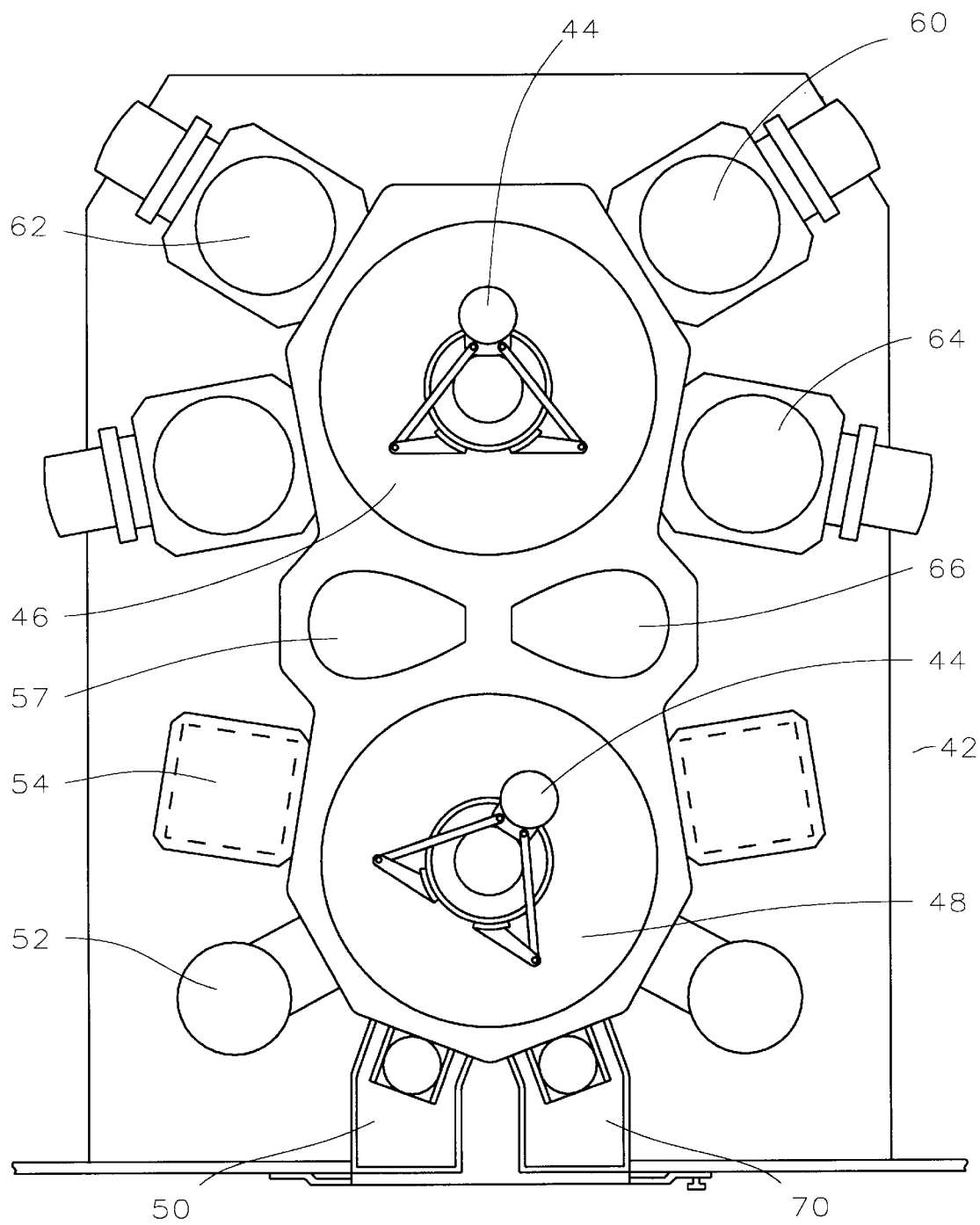
FIG. 3 is a cross-section in top view of a deposition chamber transfer system.

Referring now more particularly to FIG. 3, there is illustrated a portion of a cleanroom transfer system 42. Wafer handler robots 44 within the buffer chamber 48 and the transfer chamber 46 transfer the wafers between chambers. The wafer enters the cleanroom through the load/lock port 50. The wafer is degased in the degas chamber 52, then goes through a pre-clean in chamber 54. Next, the titanium layer is deposited in chamber 60 followed by deposition of the aluminum layer in 62. It has been found that the transfer system in the deposition chamber can effect the metal residue.

Figure 4:
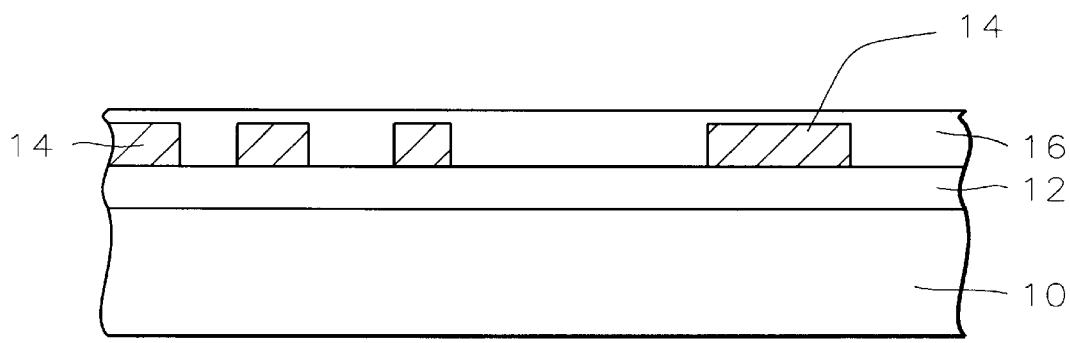
FIGS. 4 through 8 schematically illustrate in cross-sectional representation a preferred embodiment of the present invention.

FIG. 4 illustrates a portion of a partially completed integrated circuit device. There is shown a semiconductor substrate 10, preferably composed of monocrystalline silicon. Semiconductor device structures such as gate electrodes and source and drain regions, not shown, may be formed in and on the substrate and covered with a dielectric layer 12.

A first conducting layer, such as metal or polysilicon is deposited over the planarized dielectric layer 12 and patterned to form conducting lines 14. An interlevel dielectric layer 16 is deposited over the metal lines 14 as is conventional in the art.

Now the metallization process of the present invention will be described. The wafer is placed into the deposition chamber through the load/lock chamber 50, shown in FIG. 3. The wafer is degased in chamber 52, then undergoes pre-cleaning in chamber 54. A single step is added to the conventional deposition process. This single step will decrease the metal residue formed after metal etching.

The wafer is transferred to the bypass chamber 57 where the wafer is cooled by flowing water into the chamber at about 11° C. for about 30 seconds. This will cool the wafer to a temperature of below about 20° C. This water cooling increases the efficiency of the cooling process and will not impact the wafers per hour throughput of the metal deposition system.

Figure 5:
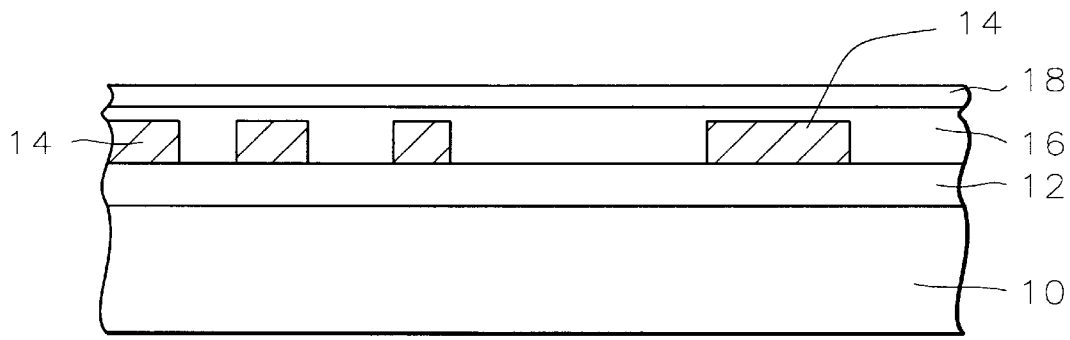

From here, the wafer is transferred to chamber 60 where the titanium layer 18 is deposited, as shown in FIG. 5. The titanium layer may be deposited at a temperature of about 100° C. to a thickness of between about 150 to 1500 Angstroms.

Figure 6:
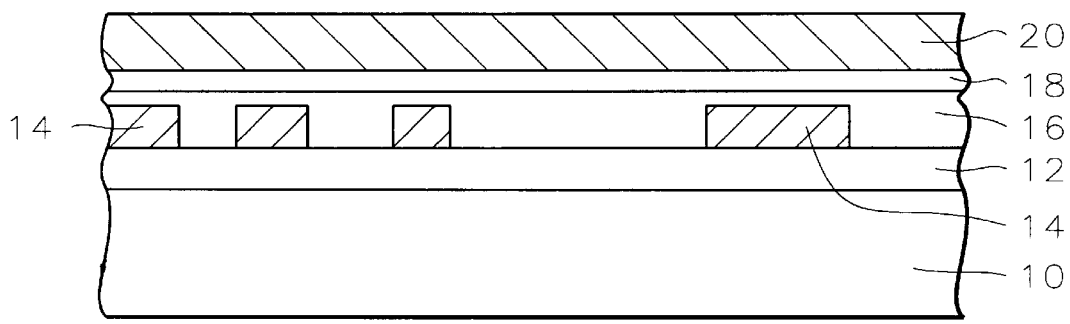

Next, the wafer is transferred to chamber 62 where the aluminum 20 is deposited, as shown in FIG. 6. The aluminum layer may be AlSiCu deposited at a temperature of about 300° C. to a thickness of between about 800 to 8000 Angstroms.

Alternatively, the wafer could be cooled in chamber 57 after the titanium deposition and before the aluminum deposition. In this case, the wafer is gas cooled from the backside of the wafer.

Figure 9:
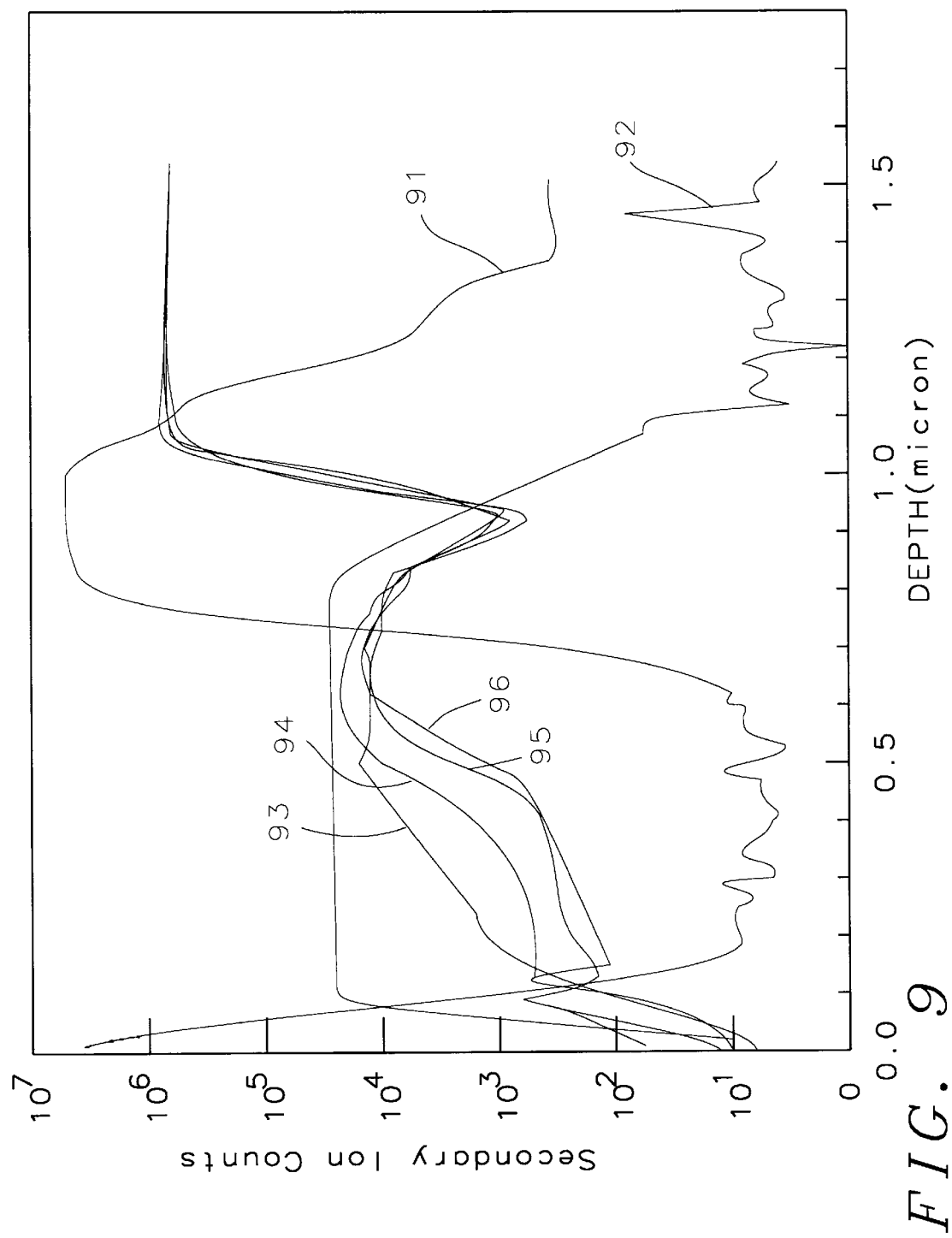
FIGS. 9 and 10 graphically represent the distribution of silicon within the metal layer.

Cooling the wafer before aluminum deposition changes the distribution of silicon in the aluminum and thus influences the metal etching process. FIG. 9 is a SIMS analysis of the silicon ion distribution in the AlSiCu layer for different deposition temperatures. Line 91 shows the titanium distribution, line 92 shows the copper distribution, and lines 93–96 show the silicon distribution. Line 95 is the silicon distribution for AlSiCu deposited at 300° C. using the HP transfer system having one transfer blade. The other lines show the silicon distribution for AlSiCu deposited at 270° C. (line 93), 300° C. (line 94), and 320° C. (line 96), all using the VHP transfer system which has two transfer blades. The lower temperature (line 93) shows broader distribution while the higher temperature (line 96) or the HP system (line 95) has a sharper curve and is closer to the interface of the titanium and the AlSiCu. This phenomenon was also seen in a TEM analysis. For metal etching, it is easier if the silicon distribution is nearer the substrate.

The inventors of the present invention performed a loop test to determine the best way to cool the wafer so that metal residues were minimized. Table 1 illustrates various processes used in the VHP transfer system and the resulting metal residues observed. The VHP system is preferred because its two transfer blades increase the system throughput.

TABLE 1

| # | Condtion | Residue |
|---|---|---|
| 1 | standard (CHA: 20 sec) | 142 |
| 2 | etch chamber bypass | 59 |
| 3 | CHA (bypass) 0 secs | 78 |
| *4 | CHA (bypass) 80 secs | 20 |
| *5 | CH3 (Ti dep) precool 30 secs | 27 |
| *6 | CH3 (Ti dep) precool 60 secs | 20 |
| *7 | CH3 (Ti dep) postcool 30 secs | 20 |
| *8 | CH3 (Ti dep) postcool 60 secs | 15 |
| 9 | CH2 (AlSiCu dep) preheat 30 secs | >200 |
| *10 | CH2 (AlSiCu dep) postcool 30 secs | 21 |
| *11 | CH2 (AlSiCu dep) postcool 60 secs | 28 |
| 12 | CH4 (TiN dep) delay 60 secs | 34 |
| 13 | CH4 (TiN dep) shorten delay | 41 |

It can be seen from Table 1 that the processes marked with an '*' have very low metal residue. Cooling before or after the AlSiCu deposition step resulted in low metal residue.

The inventors performed another loop test to determine if the addition of the cooling step in chamber A (CHA), the bypass chamber, would affect throughput. Table 2 illustrates various processes along with the resulting residue and throughput measured in wafers per hour (WPH).

TABLE 2

| # | Condition | Residue | WPH |
|---|---|---|---|
| 1 | VHP system, standard | 249 | 37 |
| 2 | HP system, standard | 64 | 33.5 |
| *3 | VHP, standard AlSiCu dep temp 320° C. | 25 | 37 |
| 4 | VHP, CHA: 85 secs + 15 secs | 93 | 26 |
| 5 | VHP, TI postcool 30 secs | 59 | 28.5 |
| 6 | VHP, CHA: 15 + 5 secs; water cooling | 106 | 37 |
| *7 | VHP, CHA: 30 + 5 secs; water cooling | 41 | 37 |
| *8 | VHP, CHA: 15 + 5 secs; water cooling; AlSiCu 320° C. | 8 | 37 |
| *9 | VHP, CHA: 15 + 5 secs; water cooling; Ti postcool 30 secs | 24 | 28.5 |

Figure 10:
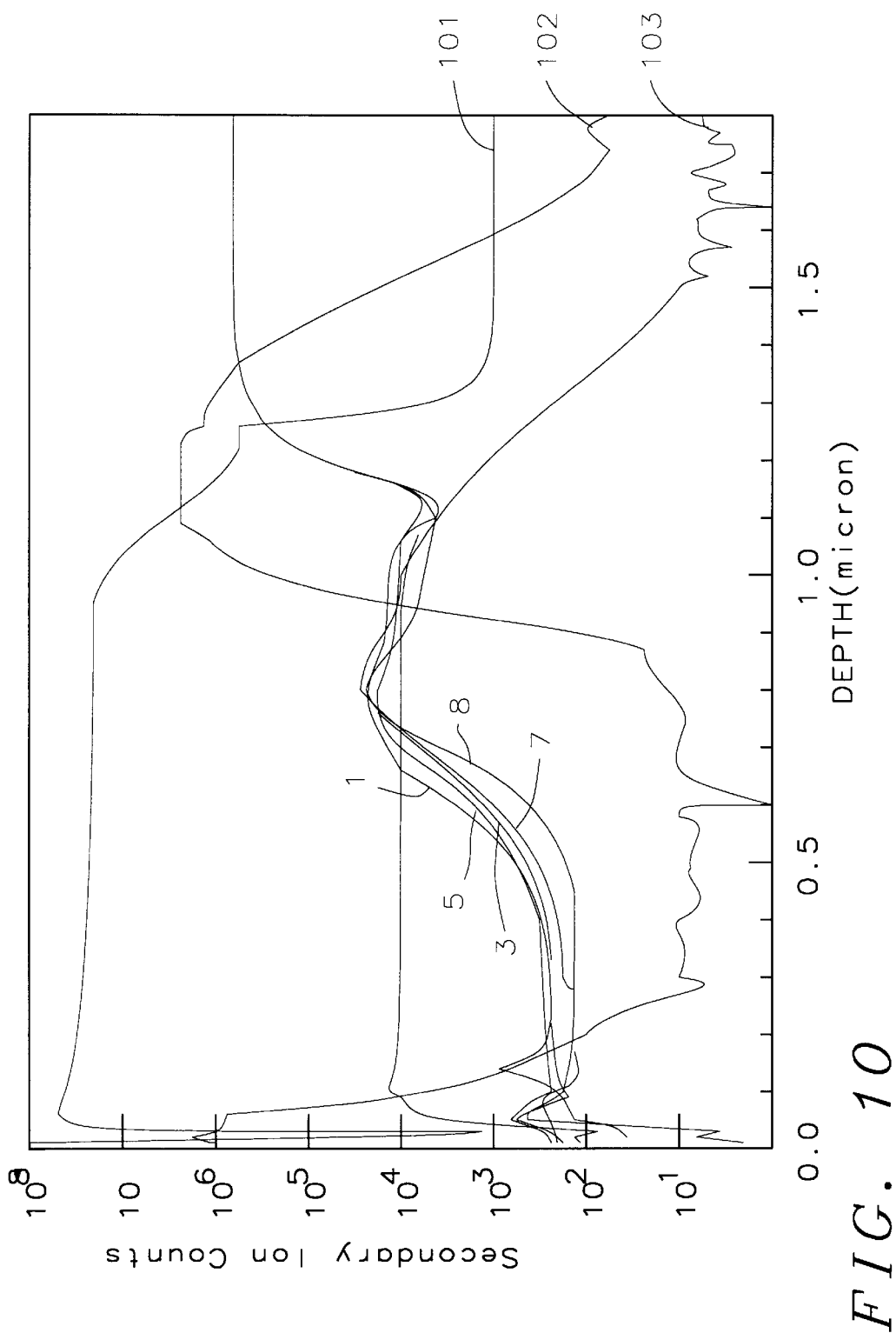

The results from Table 2 show that the addition of cooling water in the bypass chamber, chamber A (CHA), and increasing the AlSiCu temperature are possible solutions for metal residue. The silicon distribution of the SIMS analysis, illustrated in FIG. 10, shows the same result. That is, the silicon distribution closer to the interface of Ti/AlSiCu got a better result.

FIG. 10 is a SIMS analysis showing the distribution of aluminum (line 101), titanium (line 102) and copper (line 103) and showing the silicon distribution for various processes (lines 1, 3, 5, 7, and 8). Line numbers correspond to the lines in Table 2.

From the results in Tables 1 and 2, the inventors have concluded that the addition of a cooling procedure before AlSiCu deposition can improve the process window of the metal residue. The bypass chamber implemented with cooling water can increase the cooling efficiency and will not effect the wafer per hour throughput of the transfer system.

Figure 7:
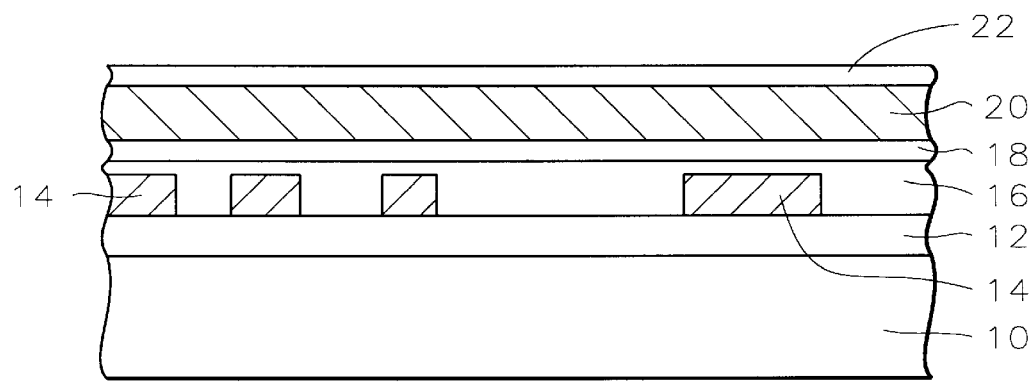

Processing now continues as is conventional. A titanium nitride capping layer 22 is deposited over the aluminum layer, as illustrated in FIG. 7, in the chamber 64. The titanium nitride layer may be deposited to a thickness of between about 50 to 300 Angstroms. The wafer then enters the cooldown chamber 66, then exits through the load/lock chamber 70.

Figure 8:
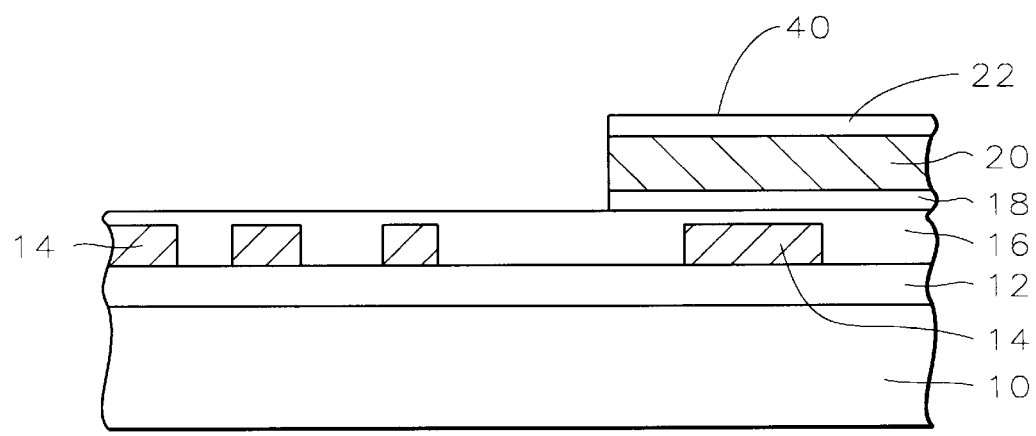

Now, the metal layers 22, 20, and 18 are etched away where not covered by a mask (not shown) to form the metal line 40, as illustrated in FIG. 8. No metal residue results. The cooling process of the present invention prior to the aluminum deposition prevents the metal residue.

The process of the present invention provides a simple and effective method of decreasing metal residue. The water cooling process of the present invention improves the process window of metal residue while maintaining wafer throughput.

While the invention has been particularly shown and described with reference to the preferred embodiments thereof, it will be understood by those skilled in the art that various changes in form and details may be made without departing from the spirit and scope of the invention.

What is claimed is:

1. A method of forming a metal line on a wafer in the fabrication of an integrated circuit comprising:
providing a first patterned conducting layer covered by an insulating layer and overlying a dielectric layer on the surface of a semiconductor substrate;
cooling said wafer by immersing said wafer in water;
thereafter depositing a metal layer overlying said insulating layer; and
etching away said metal layer where it is not covered by a mask to complete formation of said metal line on said wafer in the fabrication of said integrated circuit.

2. A method according to claim 1 wherein said step of cooling said wafer comprises immersing said wafer in water at a temperature of about 11° C. for 30 seconds.

3. A method according to claim 1 wherein said wafer is cooled to a temperature of below about 20° C.

4. A method according to claim 1 wherein said metal layer comprises:

a first layer of titanium;

a layer of aluminum overlying said titanium layer; and a layer of titanium nitride overlying said aluminum layer.

5. A method according to claim 4 wherein said aluminum layer comprises AlSiCu.

6. A method according to claim 1 wherein said metal layer comprises AlSiCu.

7. A method according to claim 1 wherein said step of cooling said wafer decreases the formation of metal residue after said step of etching away said metal layer.

8. A method of forming a metal line on a wafer without metal residue in the fabrication of an integrated circuit comprising:

providing a first patterned conducting layer covered with an insulating layer and overlying a dielectric layer on the surface of a semiconductor substrate;

cooling said wafer to a temperature of less than about 20° C. by immersing said wafer in water at a temperature of about 11° C. for 30 seconds;

thereafter depositing a metal layer overlying said insulating layer wherein said cooling said wafer prevents formation of metal precipitates; and etching away said metal layer where it is not covered by a mask wherein said prevention of said metal precipitates prevents metal residue after said etching to complete formation of said metal line on said wafer without said metal residue in the fabrication of said integrated circuit.

9. A method according to claim 8 wherein said metal layer comprises:

a first layer of titanium;

a layer of aluminum overlying said titanium layer; and a layer of titanium nitride overlying said aluminum layer.

10. A method according to claim 9 wherein said aluminum layer comprises AlSiCu.

11. A method according to claim 8 wherein said metal layer comprises AlSiCu.

12. A method of forming a metal line on a wafer in, the fabrication of an integrated circuit comprising:

providing a first patterned conducting layer covered by an insulating layer and overlying a dielectric layer on the surface of a semiconductor substrate;

water cooling said wafer by immersing said wafer in water;

thereafter depositing a titanium layer overlying said insulating layer;

depositing an AlSiCu layer overlying said titanium layer;

depositing a titanium nitride layer overlying said AlSiCu layer; and etching away said titanium nitride, AlSiCu, and titanium layers where they are not covered by a mask to complete formation of said metal line on said wafer in the fabrication of said integrated circuit.

13. A method according to claim 12 wherein said step of water cooling said wafer comprises immersing said wafer in water at a temperature of about 11° C. for 30 seconds.

14. A method according to claim 12 wherein said wafer is cooled to a temperature of less than about 20° C.

15. A method according to claim 12 wherein said step of water cooling said wafer is performed before said step of depositing said AlSiCu layer.

16. A method according to claim 12 wherein said step of water cooling said wafer decreases the formation of metal residue after said step of etching away said metal layer.

* * * * *

UNITED STATES PATENT AND TRADEMARK OFFICE
CERTIFICATE OF CORRECTION

PATENT NO. : 5,994,219
DATED : November 30, 1999
INVENTOR(S) : Hsiang-Lin Lin, Han-Chung Chen It is certified that error appears in the above-identified patent and that said Letters Patent is hereby corrected as shown below:

On the Cover Page, at (54), delete "IMPROVED", and replace with --IMPROVE--.

Column 1, line 3, "IMPROVED," should read --IMPROVE--.

Signed and Sealed this

Twenty-seventh Day of March, 2001

Attest:

NICHOLAS P. GODICI

Attesting Officer   Acting Director of the United States Patent and Trademark Office